United States Patent [19]
Suzuki

[11] Patent Number: 5,929,681
[45] Date of Patent: Jul. 27, 1999

[54] DELAY CIRCUIT APPLIED TO SEMICONDUCTOR MEMORY DEVICE HAVING AUTO POWER-DOWN FUNCTION

[75] Inventor: Koichi Suzuki, Kawasaki, Japan

[73] Assignee: Fujitsu Limited, Kawasaki, Japan

[21] Appl. No.: 08/902,273

[22] Filed: Jul. 29, 1997

[30] Foreign Application Priority Data

Mar. 19, 1997 [JP] Japan .................................... 9-066296

[51] Int. Cl.[6] ........................................................ H03K 5/13
[52] U.S. Cl. ........................... 327/284; 327/264; 327/262
[58] Field of Search ..................................... 327/261, 262, 327/263, 264, 266, 284, 285, 287, 288

[56] References Cited

U.S. PATENT DOCUMENTS

| | | | |
|---|---|---|---|
| 4,359,649 | 11/1982 | Mundel | 307/268 |
| 5,063,313 | 11/1991 | Kikuda et al. | 307/605 |
| 5,610,546 | 3/1997 | Carbou et al. | 327/261 |
| 5,793,238 | 8/1998 | Baker | 327/262 |
| 5,801,567 | 9/1998 | Kosiec | 327/263 |

*Primary Examiner*—Timothy P. Callahan
*Assistant Examiner*—Eunja Shin
*Attorney, Agent, or Firm*—Nikaido, Marmelstein, Murray & Oram, LLP

[57] ABSTRACT

A delay circuit includes a charge/discharge circuit and a logic circuit. The charge/discharge circuit is used to moderate a slope of change of an input signal. The logic circuit receives a charge/discharge signal output from the charge/discharge circuit, and is used to change an output signal of the logic circuit when the charge/discharge signal exceeds a threshold value of the logic circuit. A time constant in the charge/discharge circuit is varied in accordance with the change in the output signal of the logic circuit. This serves to alleviate the malfunctioning and timing constraint problems that occur after the threshold value of the next-stage circuit (logic circuit) is exceeded.

23 Claims, 12 Drawing Sheets

Fig.20
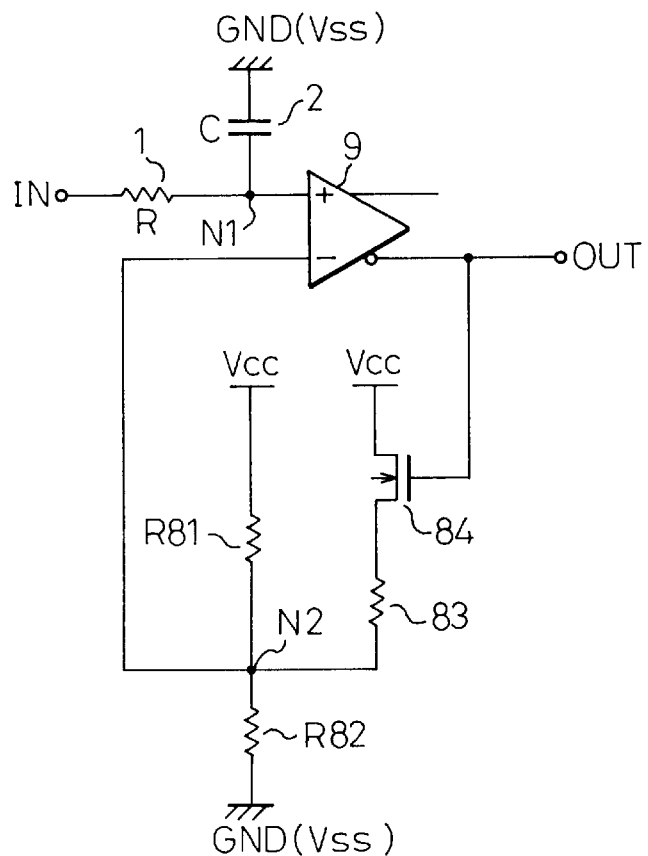
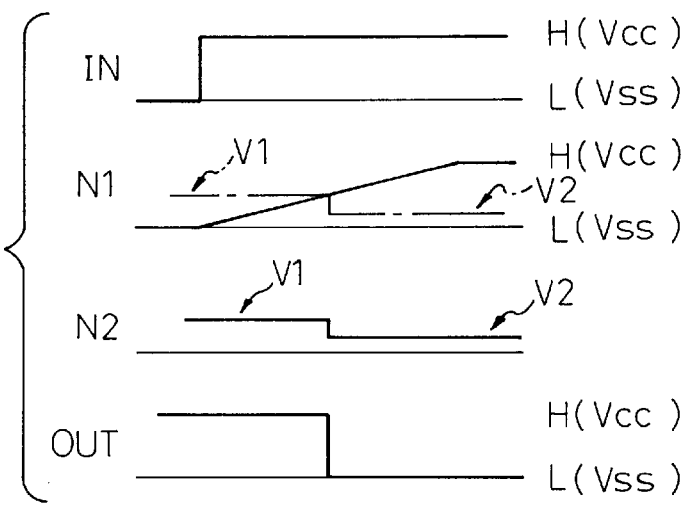
Fig.21

DELAY CIRCUIT APPLIED TO SEMICONDUCTOR MEMORY DEVICE HAVING AUTO POWER-DOWN FUNCTION

BACKGROUND OF THE INVENTION

1. Field of the Invention

The present invention relates to a delay circuit and a semiconductor memory device, and more particularly to a delay circuit that is applied to a semiconductor device having an auto power-down function.

2. Description of the Related Art

With increasing functional complexity in various kinds of circuits in recent years, it has come to be widely practiced to supply signals by delaying signal timing. This trend has brought a need for a delay circuit which can change its delay time, requires fewer components, and consumes less current, and which can output a delayed signal without being affected by noise or by fluctuations in supply power.

Namely, in the prior art, a delay circuit (CR delay circuit) comprises, for example, a resistor, a capacitor, and an inverter. Note that, the voltage change of the input signal is slowed by a time constant (T=CR) of the resistor and capacitor, thereby delaying the timing at which the input voltage to the inverter at the next stage exceeds the threshold voltage of the inverter. In this way, an output signal, which is delayed with respect to the input signal of the delay circuit, can be obtained.

However, in the prior art delay circuit, the input voltage of the inverter is determined only by the time constant of the resistor and capacitor, and thus the change of the voltage is still slow after the threshold voltage is exceeded. Therefore, if the input voltage fluctuates, and if the input voltage of the inverter drops again below the threshold voltage, an unwanted pulse may be included in the output signal.

The prior art delay circuit and problems associated with the prior art delay circuit will be described in detail later with reference to drawings.

SUMMARY OF THE INVENTION

An object of the present invention is to provide a delay circuit capable of alleviating the malfunctioning and timing constraint problems that occur after the threshold value of the next-stage circuit is exceeded. It is also an object of the present invention to provide a semiconductor memory device incorporating such a delay circuit.

According to the present invention, there is provided a delay circuit comprising a charge/discharge circuit for moderating a slope of change of an input signal; and a logic circuit, receiving a charge/discharge signal output from the charge/discharge circuit, for changing an output signal of the logic circuit when the charge/discharge signal exceeds a threshold value of the logic circuit, wherein a time constant in the charge/discharge circuit is varied in accordance with the change in the output signal of the logic circuit.

Further, according to the present invention, there is also provided a semiconductor memory device having a cell matrix having a plurality of memory cells; a data latch for latching readout data output from the cell matrix; an address transfer detection circuit for detecting an address signal change; a delay circuit, outputting a latch control signal to the data latch in accordance with an output signal of the address transfer detection circuit, for controlling the data latch to output the readout data in synchronism with the latch control signal, wherein the delay circuit comprises a charge/discharge circuit for moderating a slope of change of an input signal; and a logic circuit, receiving a charge/discharge signal output from the charge/discharge circuit, for changing an output signal of the logic circuit when the charge/discharge signal exceeds a threshold value of the logic circuit, wherein a time constant in the charge/discharge circuit is varied in accordance with the change in the output signal of the logic circuit.

The charge/discharge circuit may comprise a switch element whose one end is connected to an input of the logic circuit, and a capacitor element whose one end is connected to the other end of the switch element, wherein a switching operation of the switch element may be controlled by the output signal of the logic circuit to vary the time constant of the charge/discharge circuit due to the capacitor element. The switch element may be controlled in such a manner as to be switched OFF by the output signal of the logic circuit when the output signal of the logic circuit changes in response to the charge/discharge signal exceeding the threshold value of the logic circuit.

There may be provided a plurality of the capacitor elements whose connection to the input of the logic circuit is controlled by the switch element, and the plurality of capacitor elements may be arranged in parallel with each other. At least one of the plurality of capacitor elements may be connected, at one end, to the other end of the switch element and at the other end to a prescribed power supply line. At least one of the plurality of capacitor elements may be connected at one end to the other end of the switch element and at the other end to an output of a driver circuit supplied with a prescribed control signal.

The charge/discharge circuit may be inserted in an input of the logic circuit, and may comprise a resistor element for supplying the input signal via the resistor element, and a switch element disposed in parallel with the resistor element, wherein a switching operation of the switch element may be controlled by the output signal of the logic circuit to vary the time constant of the charge/discharge circuit due to the resistor element. The switch element may be controlled in such a manner as to be switched ON by the output signal of the logic circuit when the output signal of the logic circuit changes in response to the charge/discharge signal exceeding the threshold value of the logic circuit. There may be provided a plurality of the switch elements and a plurality of the resistor elements whose short-circuiting with the input of the logic circuit is controlled by the switch element, and the plurality of switch elements and the plurality of resistor elements may be respectively arranged in series with each other. The plurality of switch elements for controlling the short-circuiting of the plurality of resistor elements may be each controlled for switching, by the output signal of the logic circuit.

The charge/discharge circuit may include a current source, and a current flowing through the current source may be controlled by the output signal of the logic circuit. The current flowing through the current source may be controlled so that the current increases when the output signal of the logic circuit changes in response to the charge/discharge signal exceeding the threshold value of the logic circuit. The logic circuit may comprise a comparator, a first input terminal of which is supplied with the charge/discharge signal from the charge/discharge circuit, and a second input terminal of which is supplied with a reference voltage, wherein a control may be carried out to vary the reference voltage in accordance with the output signal of the logic circuit.

The logic circuit may comprise a CMOS inverter. The capacitor element may be constituted as a CMOS capacitor. The semiconductor memory device may be a flash EEPROM.

BRIEF DESCRIPTION OF THE DRAWINGS

The present invention will be more clearly understood from the description of the preferred embodiments as set forth below with reference to the accompanying drawings, wherein:

FIG. 20 is a circuit diagram showing a fifth embodiment of a delay circuit according to the present invention; and FIG. 21 is a waveform diagram for explaining an operation of the delay circuit shown in FIG. 20.

DESCRIPTION OF THE PREFERRED EMBODIMENTS

Before describing the preferred embodiments of the delay circuit according to the present invention, a prior art delay circuit and problems associated with the prior art delay circuit will be described with reference to FIGS. 1 to 4.

Figure 1:
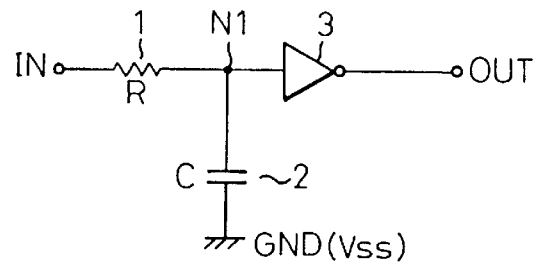
FIG. 1 is a circuit diagram showing an example of a delay circuit according to the prior art.

FIG. 1 is a circuit diagram showing one example of the prior art delay circuit.

As shown in FIG. 1, the prior art delay circuit (CR delay circuit) comprises, for example, a resistor 1, a capacitor 2, and an inverter 3. More specifically, the resistor 1 is inserted between an input (IN) of the delay circuit and a node N1 (input of the inverter 3), and the capacitor 2 is provided between the node N1 and a ground line (GND; Vss). The configuration is such that, with the time constant (T=CR) of the resistor 1 and capacitor 2, the voltage change of the input signal IN is slowed thereby delaying the timing at which the input voltage (voltage at the node N1) to the inverter 3 at the next stage exceeds the threshold voltage Vth of the inverter 3. In this way, an output signal OUT (equal to the input signal but with inverted level), delayed with respect to the input signal IN of the delay circuit, can be obtained. Here, the resistor 1 and the capacitor 2 together constitute a charging circuit (charge/discharge circuit). The inverter 3 may be replaced by another logic circuit having a prescribed threshold value.

Figure 2:
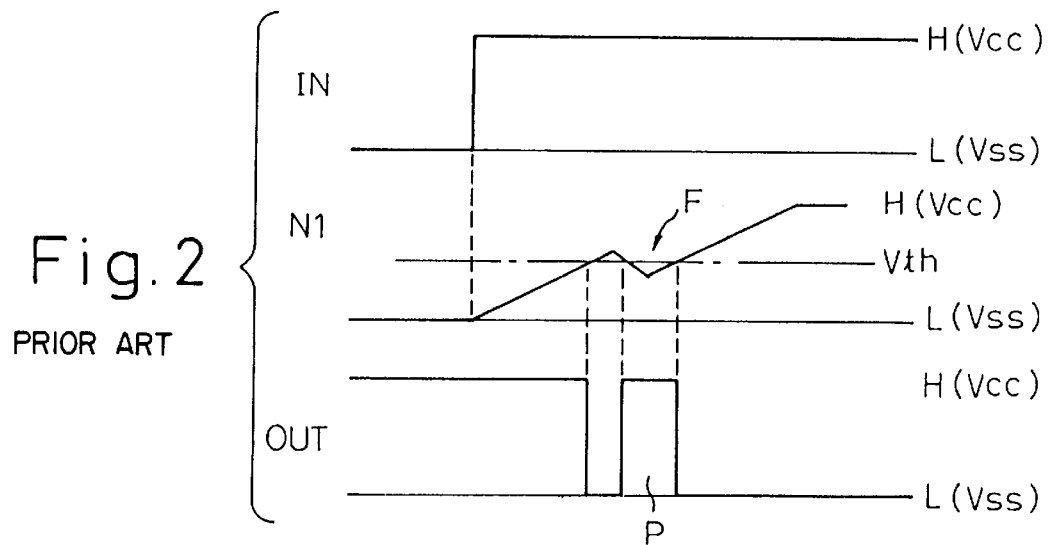
FIG. 2 is a waveform diagram for explaining a problem associated with the delay circuit shown in FIG. 1.

FIG. 2 is a waveform diagram for explaining the problem of the delay circuit shown in FIG. 1.

As shown in FIG. 2, when the input signal IN changes from a low level "L" (low-level supply voltage Vss) to a high level "H" (high-level supply voltage Vcc), the input voltage (N1) to the inverter 3 slowly rises in accordance with the time constant of the resistor 1 and capacitor 2, and when the threshold voltage Vth of the inverter 3 is exceeded, the output signal OUT with inverted level is output.

However, in the prior art delay circuit shown in FIG. 1, since the input voltage (N1) to the inverter 3 is determined only by the time constant of the resistor 1 and capacitor 2, the change of the voltage (N1) is still slow after the threshold voltage is exceeded. Therefore, if the input voltage IN fluctuates (see reference sign F in FIG. 2), for example, because of the effects of noise or fluctuating supply voltage, and if the input voltage (N1) to the inverter 3 drops again below the threshold voltage Vth, an unwanted portion (unwanted pulse P) will be included in the output signal OUT; this can lead to the malfunctioning of a circuit operating by receiving the output signal (delayed output) OUT.

Figure 3:
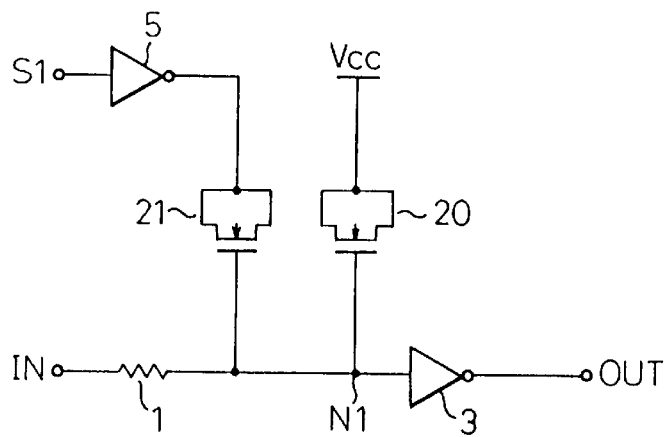
FIG. 3 is a circuit diagram showing another example of a delay circuit according to the prior art.

FIG. 3 is a circuit diagram showing another example of the prior art delay circuit.

As shown in FIG. 3, the delay circuit comprises, for example, a resistor 1, N-channel MOS transistors 20 and 21, a CMOS inverter 3, and a driver (CMOS inverter) 5. Here, the transistors 20 and 21 are each used as a MOS capacitor with source and drain connected together. One end of each of the MOS capacitors (transistors) 20 and 21 is connected to the input (node N1) of the inverter 3, while the other end (source and drain) of the MOS capacitor 20 is connected to a high-level voltage supply line (Vcc), and the other end (source and drain) of the MOS capacitor 21 is connected to the output of the inverter (driver) 5 whose input is supplied with a control signal S1. Here, the resistor 1 and the MOS capacitors 20 and 21 together constitute a charging circuit (charge/discharge circuit).

The delay circuit shown in FIG. 3 is configured to vary the rising slope of the input voltage (N1) to the inverter 3 by controlling the contribution (connection) of the MOS capacitor 21 by the control signal S1.

Figure 4:
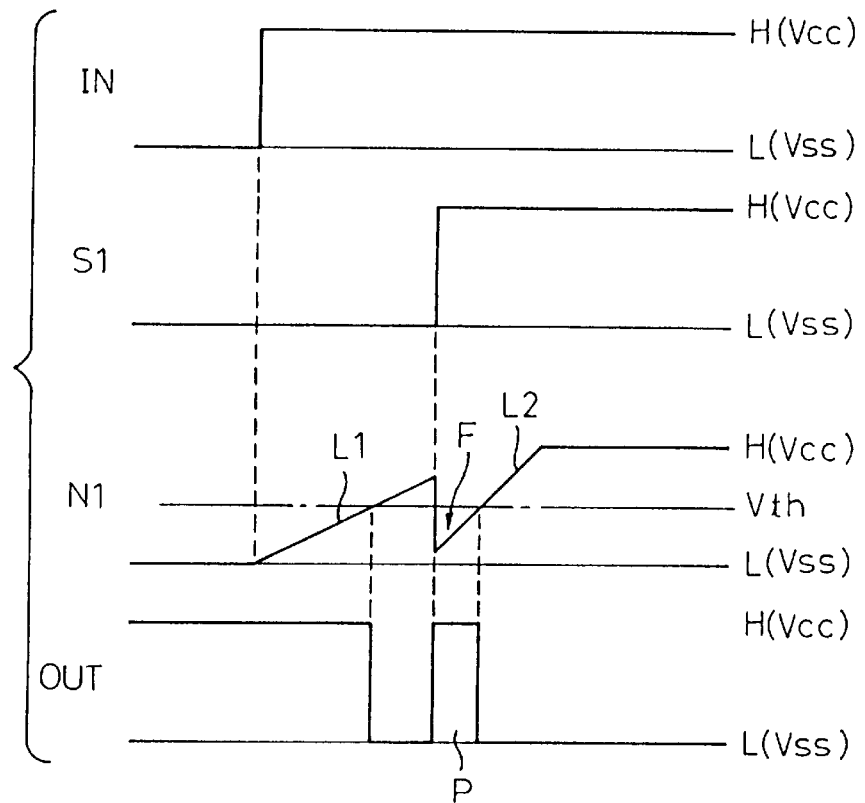
FIG. 4 is a waveform diagram for explaining a problem associated with the delay circuit shown in FIG. 3.

FIG. 4 is a waveform diagram for explaining the problem of the delay circuit shown in FIG. 3.

As shown in FIG. 4, when the control signal S1 is at a low level "L" (low-level supply voltage Vss), the output (the other end of the MOS capacitor 21) of the inverter 5 is at a high level "H" (high-level supply voltage Vcc). Here, since the high-level supply voltage Vcc is also supplied to the other end of the MOS capacitor 20, when the input signal IN changes from the low level "L" to the high level "H" the level of the node N1 (input voltage to the inverter 3) rises slowly, as shown by reference sign L1 in FIG. 4, because the two MOS capacitors 20 and 21 are both contributing.

After the input voltage (N1) to the inverter 3 exceeds the threshold voltage Vth of the inverter 3, when the control signal S1 changes from the low level "L" to the high level "H" the output (the other end of the MOS capacitor 21) of the inverter 5 is driven to the low level "L", so that the charge on the node N1 (the charge stored in the MOS capacitors 20 and 21) is released through the MOS capacitor 21. As a result, the input voltage (N1) to the inverter 3 drops again below the threshold voltage Vth of the inverter 3, as shown by reference sign F in FIG. 4, and an unwanted portion (unwanted pulse) P is included in the output voltage OUT.

That is, in the configuration where the MOS capacitor 21 is isolated by using the control signal S1, the input voltage (N1) to the inverter 3 may drop again below the threshold voltage Vth because of the discharging action of the isolated MOS capacitor 21, depending on the timing of the control signal S1. This timing problem imposes a constraint on circuit operation.

The problem described with reference to FIGS. 3 and 4 occurs, for example, when the delay circuit is applied to a flash EEPROM (flash memory).

Next, a flash EEPROM, as an example of a semiconductor memory device, and a read operation and auto power-down operation of the flash EEPROM will be described with reference to FIGS. 5 to 7.

Figure 5:
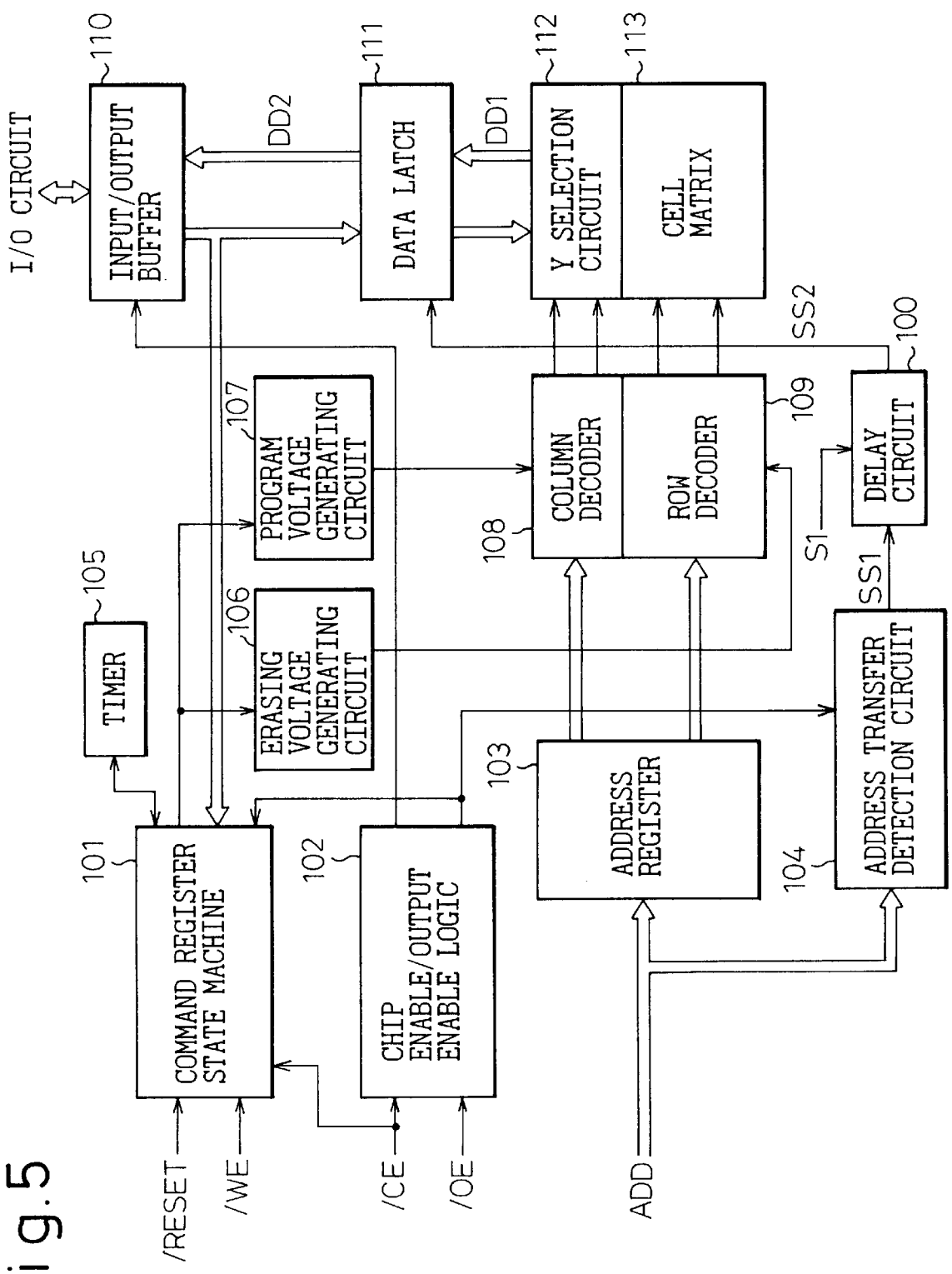
FIG. 5 is a block diagram showing a configuration of a flash EEPROM as an example of a semiconductor memory device incorporating a delay circuit according to the present invention.

FIG. 5 is a block diagram showing the configuration of a flash EEPROM, as an example of a semiconductor memory device, incorporating the delay circuit. In FIG. 5, reference numeral 100 is the delay circuit, 101 is a command register state machine, 102 is a chip enable/output enable logic, 103 is an address register, 104 is an address transfer detection circuit, 105 is a timer, 106 is an erasing voltage generating circuit, and 107 is a program voltage (writing voltage) generating circuit. Further, reference numeral 108 is a column decoder, 109 is a row decoder, 110 is an input/output buffer, 111 is a data latch, 112 is a Y selection circuit, and 113 is a cell matrix.

As shown in FIG. 5, the command register state machine 101 is supplied with a reset signal /RESET, a write enable signal /WE, and a chip enable signal /CE, as well as an output from the timer 105 and an output signal from the chip enable/output enable logic 102, and controls the erasing voltage generating circuit 106, the program voltage generating circuit 107, etc. by supplying control signals in accordance with the signals /RESET, /WE, and /CE. The chip enable/output enable logic 102 receives the chip enable signal /CE and output enable signal /OE, and controls the input/output buffer 110, etc.

The input/output buffer 110 is used to transfer data to and from an I/O circuit; that is, data (readout output data DD2) from the data latch 111 is output to the I/O circuit, and data (write data, command data, etc.) from the I/O circuit is transferred to the data latch 111 and command register state machine 110.

The address register 103 receives an address signal ADD and supplies a column address and row address to the column decoder 108 and row decoder 109, respectively, and a cell (memory cell) in the cell matrix (memory cell array) 113, specified by the address signal ADD, is selected. More specifically, a word line is selected by the row decoder 109, and at the same time, a bit line is selected by the Y selection circuit 112 controlled by the column decoder 108, to write or read data in the cell specified by the address signal ADD. Here, the high-level voltage (program voltage) used when writing is supplied from the program voltage generating circuit 107 to the column decoder 108, and applied via the Y selection circuit 112 to the cell specified by the address signal ADD. On the other hand, the output voltage (erasing voltage) from the erasing voltage generating circuit 106 is supplied to the row decoder 109, and is used to erase the entire data in the cell matrix 113.

The address signal ADD is also supplied to the address transfer detection circuit 104 which then detects the transfer of the address signal. An output (an address transfer detection signal SS1) of the address transfer detection circuit 104 is supplied to the delay circuit 100, and using an output (SS2) of the delay circuit 100, the operation (latch operation) of the data latch 111 is controlled. More specifically, the data latch 111 latches the memory readout data DD1 supplied via the Y selection circuit 112, in synchronism with the output signal (latch control signal) SS2 of the delay circuit 100, and outputs the output data DD2 via the input/output buffer 110.

In this way, the above-described delay circuit (the delay circuit contemplated by the present invention) is applied, for example, as the delay circuit 100 in the flash EEPROM. This flash EEPROM has an auto power-down function by which internal circuitry is powered down when no address change occurs, for example, within a specified period of time.

Figure 6:
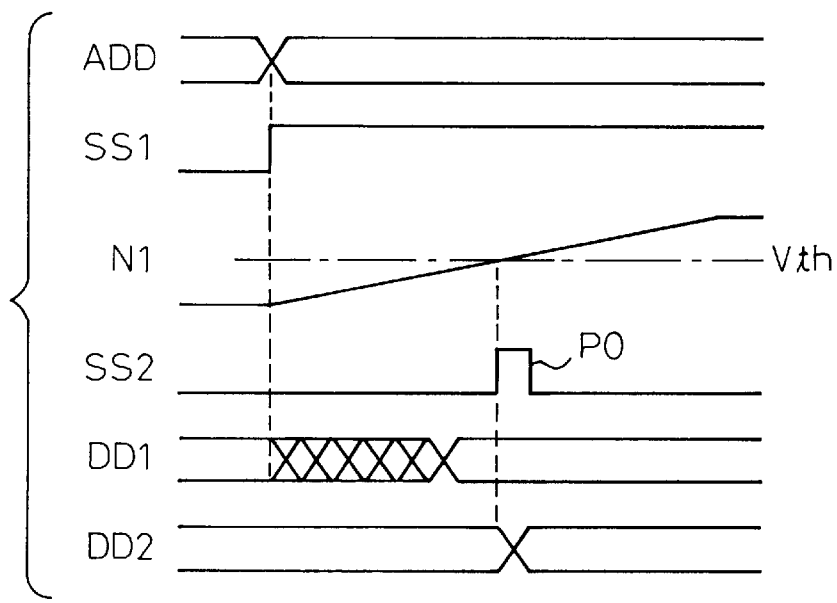
FIG. 6 is a waveform diagram for explaining a read operation of the flash EEPROM shown in FIG. 5.

FIG. 6 is a waveform diagram for explaining the read operation of the flash EEPROM shown in FIG. 5. In the read operation of the flash EEPROM which has an auto power-down operation, the output from the memory cell (cell matrix 113) must be latched by the data latch 111 because the internal circuits are powered down if, after changing the address by selecting a device (memory cell), the address does not change again within a specified period of time, for example. More specifically, since it takes, for example, more than several tens of nanoseconds before data read out of a memory cell stabilizes, the latch control signal (SS2) is output after more than several tens of nanoseconds has elapsed from the detection of an address change, to latch the readout data DD1 into the data latch 111.

As shown in FIG. 6, in a usual read operation, when the address signal ADD changes, the address transfer detection circuit 104 detects the change (transfer) of the address signal ADD, and outputs the address transfer detection signal SS1 to the delay circuit 100. The delay circuit 100 is also supplied with a power-down signal (control signal) S1. From the delay circuit 100, the latch control signal SS2 having a pulse P0 is supplied to the data latch 111 when the node N1 (input signal to the inverter 3 in FIG. 3) exceeds the threshold value Vth. Then, the data latch 111 latches the readout data DD1 in synchronism, for example, with the pulse P0 of the latch control signal SS2.

The latch control signal SS2 here is obtained, for example, as an output signal OUT from an RC delay circuit, such as shown in FIG. 3, for the address transfer detection signal SS1 as the input signal IN. This delay circuit is designed to be capable of changing the resistor/capacitor time constant (delay time), by considering cases where there is a performance margin, due to variations in process conditions, to speed up the device access time, or where stable DC-like measurements are needed when evaluating the device. The control signal (S1) for switching the delay time is programmed in the memory (flash EEPROM) to control the contribution (connection) of the capacitor (MOS capacitor).

Figure 7:
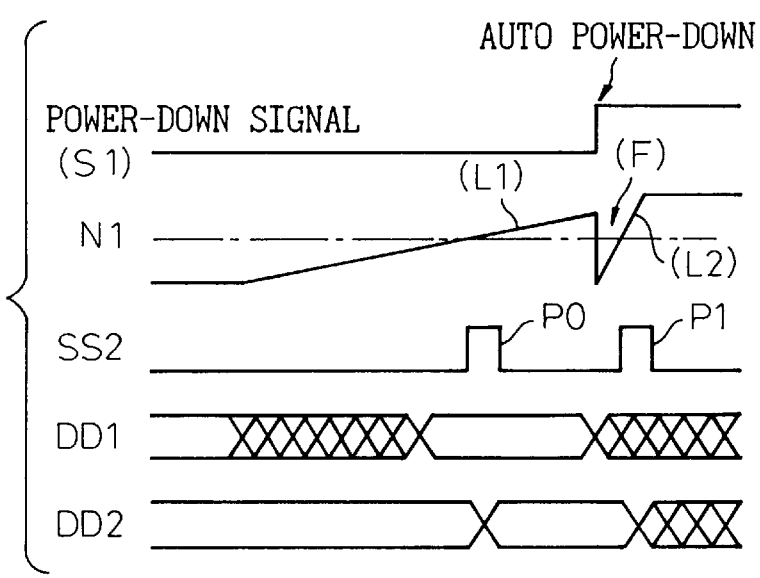
FIG. 7 is a waveform diagram for explaining an auto power-down operation of the flash EEPROM shown in FIG. 5.

FIG. 7 is a waveform diagram for explaining the auto power-down operation of the flash EEPROM shown in FIG. 5.

Normally, the above delay-time switching control signal (S1) does not change, but when the auto power-down function is activated, for example, the above delay-time switching control signal S1 cannot be read out correctly because the circuit for reading the memory (memory cell 113) is also powered down. As a result, the same problem as described with reference to FIGS. 3 and 4 may occur, as shown in FIG. 7 (see reference sign N1). That is, in addition to the normal pulse P0, a pulse (unwanted pulse) P1 occurs in the latch control signal SS2 (output signal OUT of the delay circuit 100) that is supplied from the delay circuit 100 to the data latch 111. As a result, the data latch 111 operating based on the pulses (P0, P1) of the latch control signal SS2 malfunctions, or it becomes necessary to impose a constraint on the operating timing in order to prevent the malfunctioning.

In this way, as explained with reference to FIG. 2, for example, the prior art delay circuit is so susceptible to the effects of noise, variations in supply voltage, etc. that even after the input voltage exceeds the threshold value of the next-stage circuit (inverter), the input voltage tends to drop again below the threshold value of the next-stage circuit. This tendency becomes more pronounced as the capacitance value is made larger for increased delay time, thus tending to cause circuit malfunctioning more easily.

Furthermore, as explained with reference to FIG. 3 or 7, in the prior art delay circuit and the semiconductor memory device (flash EEPROM) incorporating the prior art delay circuit, when the capacitor is constructed from an active device such as an N-channel MOS transistor and is so configured as to be isolated using a control signal (S1), for example, there occurs the possibility of the input voltage dropping below the threshold value of the next-stage circuit because of discharging unless the control signal is input after the active device is turned OFF. To prevent this, a constraint has to be imposed on circuit operation timing.

The preferred embodiments of the delay circuit according to the present invention will now be described below with reference to the accompanying drawings.

Figure 8:
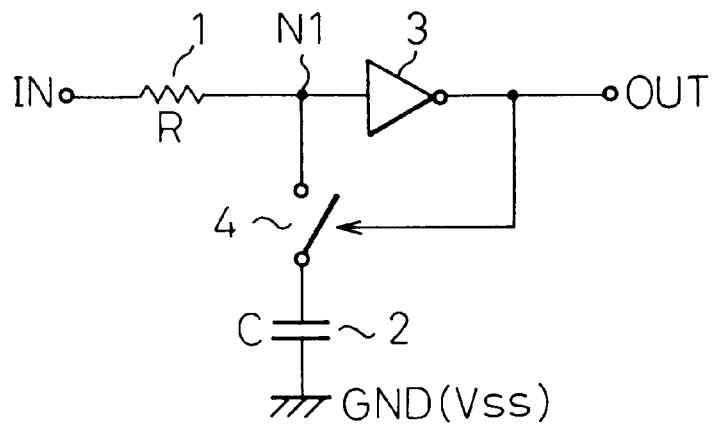
FIG. 8 is a circuit diagram showing a basic functional configuration of a delay circuit according to the present invention.

FIG. 8 is a circuit diagram showing the basic functional configuration of the delay circuit according to the present invention. In FIG. 8, reference numeral 1 is a resistor (resistor element), 2 is a capacitor (capacitor element), 3 is an inverter, and 4 is a switch means (switch element).

As is apparent from the comparison with the prior art delay circuit shown in FIG. 1, the delay circuit of the present invention shown in FIG. 8 differs from the delay circuit of FIG. 1 by the inclusion of the switch element 4 which is connected between the node N1 and one end of the capacitor 2 and which is controlled by the output signal of the inverter 3.

More specifically, the resistor 1 is provided between the input (IN) of the delay circuit and the node N1 (input of the inverter 3), while the switch element 4 and the capacitor 2 are connected in series between the node N1 and the ground line (GND, Vss). In the initial state, the switch element 4 is ON, so that as in the prior art delay circuit shown in FIG. 1, with the time constant (T=CR) of the resistor 1 and capacitor 2 the voltage change of the input signal IN is slowed thereby delaying the timing at which the input voltage (voltage at the node N1: charge/discharge voltage) to the inverter 3 at the next stage exceeds the threshold voltage Vth of the inverter 3. An output signal OUT (equal to the input signal but with inverted level), delayed with respect to the input signal IN of the delay circuit, is thus produced. Here, the resistor 1 and the capacitor 2 together constitute a charging circuit (charge/discharge circuit). The inverter 3 may be replaced by another logic circuit or the like having a threshold value.

In the delay circuit of the present invention, the switch element 4, in response to a change in the output signal OUT, is switched from the ON to the OFF state, thereby isolating the capacitor 2 from the node N1 and allowing the change of the input signal IN to be applied directly to the node N1 (the input of the inverter 3).

Figure 9:
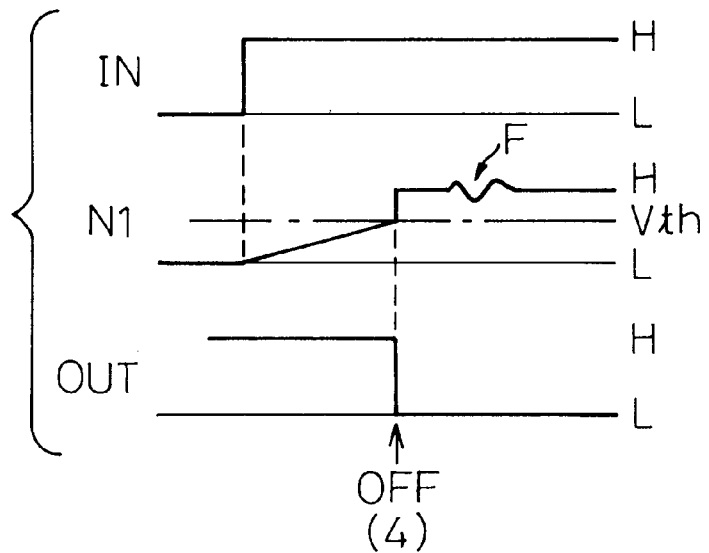
FIG. 9 is a waveform diagram for explaining an operation of the delay circuit shown in FIG. 8.

FIG. 9 is a waveform diagram for explaining the operation of the delay circuit shown in FIG. 8.

As shown in FIG. 9, when the input signal (step signal) IN changes from a low level "L" (low-level supply voltage Vss) to a high level "H" (high-level supply voltage Vcc), the input voltage (N1) to the inverter 3 slowly rises in accordance with the time constant of the resistor 1 and capacitor 2, and when the threshold voltage Vth of the inverter 3 is exceeded, the output signal OUT with inverted level (low level "L") is output. In response to the output signal OUT thus changing from the high level "H" to the low level "L", the switch element 4 changes from the ON state to the OFF state, and the capacitor 2 is isolated from the node N1.

As a result, the input signal IN is supplied to the input of the inverter 3 without being slowed by the capacitor 2. In this way, if the input signal IN fluctuates (as shown by reference sign F in FIG. 9) because of the effects of noise and variations in supply voltage, for example, since the input voltage (N1) to the inverter 3 has already risen to the high level "H" the input signal N1 does not drop below the threshold voltage Vth of the inverter 3, eliminating the possibility of an unwanted portion being included in the output signal OUT. Therefore, after the output signal has changed (delayed output is output), even if the input signal IN fluctuates because of the effects of noise, variations in supply voltage, etc., no unwanted changes occur in the output signal OUT because the margin against noise is large. This serves to prevent the malfunctioning of the circuit operating by receiving the output signal OUT.

Figure 10:
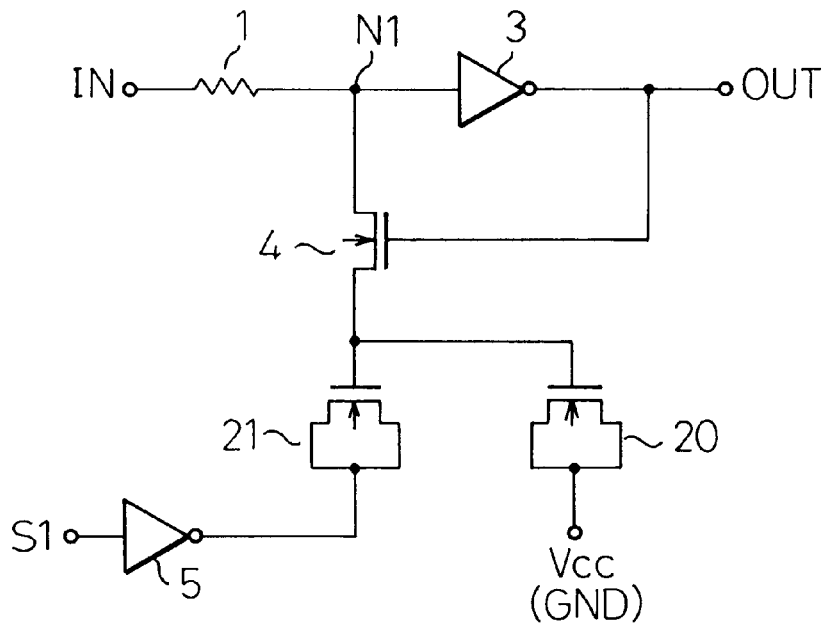
FIG. 10 is a circuit diagram showing a first embodiment of a delay circuit according to the present invention.

FIG. 10 is a circuit diagram showing a first embodiment of the delay circuit according to the present invention.

As shown in FIG. 10, the delay circuit comprises, for example, a resistor 1, N-channel MOS transistors 4, 20, and 21, an inverter (CMOS inverter) 3, and a driver (CMOS inverter) 5. Here, the transistors 20 and 21 are each used as a MOS capacitor with source and drain connected together. One end of each of the MOS capacitors (transistors) 20 and 21 is connected to the input (node N1) of the inverter 3, while the other end (source and drain) of the MOS capacitor 20 is connected to a high-level voltage supply line (Vcc), and the other end (source and drain) of the MOS capacitor 21 is connected to the output of the inverter (driver) 5 whose input is supplied with a control signal S1. Here, the resistor 1 and the MOS capacitors 20 and 21 together constitute a charging circuit (charge/discharge means).

The delay circuit shown in FIG. 10 differs from the prior art delay circuit shown in FIG. 3 by the inclusion of the transistor (switch element) 4 which is connected between the node N1 and one end of the MOS capacitor 21 and whose gate is coupled to the output (output signal OUT) of the inverter 3. More specifically, the configuration is such that using the control signal S1, the contribution (connection) of the MOS capacitor 21 is controlled to vary the rising slope of the input voltage (N1: charge/discharge signal) to the inverter 3, and when the threshold voltage Vth is exceeded thereby causing the output of the inverter 3 to invert, the transistor 4 is switched OFF to isolate the MOS capacitor 21 from the node N1.

Figure 11:
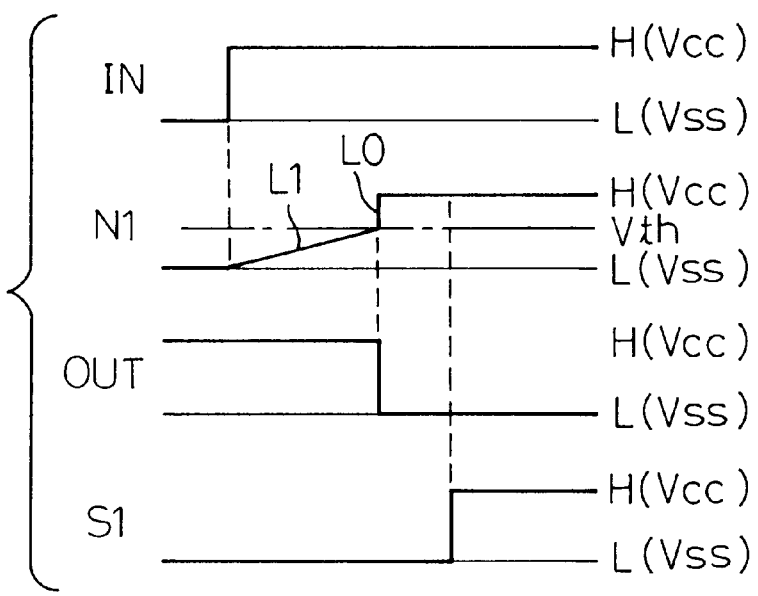
FIG. 11 is a waveform diagram for explaining an operation of the delay circuit shown in FIG. 10.

FIG. 11 is a waveform diagram for explaining the operation of the delay circuit shown in FIG. 10.

As shown in FIG. 11, when the control signal S1 is at a low level "L" (Vss), the output (the other end of the MOS capacitor 21) of the inverter 5 is at a high level "H" (Vcc). The high-level supply voltage Vcc is also applied to the other end of the MOS capacitor 20. Here, since the signal (output signal OUT) supplied to the gate of the N-channel MOS transistor 4 is at the high level "H", the transistor 4 is ON. Therefore, when the input signal IN changes from the low level "L" to the high level "H", the voltage at the node N1 (input voltage to the inverter 3) slowly rises, as shown by reference sign L1 in FIG. 11, because of accumulation of charge on the two MOS capacitors 20 and 21 (both capacitors are contributing).

Then, when the input voltage (N1) to the inverter 3 exceeds the threshold voltage Vth of the inverter 3, the output signal OUT is inverted from the high level "H" to the low level "L", and by this low-level output signal OUT, the transistor 4 is switched OFF. This causes the two MOS capacitors 20 and 21 to be isolated from the node N1, allowing the level of the node N1 to rise rapidly to the high level "H".

Thereafter, when the control signal S1 changes from the low level "L" to the high level "H", the output of the inverter 5 (the other end of the MOS capacitor 21) goes to the low level "L" (Vss), but since the transistor 4 is already switched OFF, the charge on the node N1 will not be discharged. The node N1 (input voltage to the inverter 3) is thus maintained at the high level "H". This prevents the input voltage (N1) to the inverter 3 from dropping again below the threshold voltage Vth of the inverter 3, and eliminates the possibility of an unwanted portion (unwanted pulse P) being included in the output voltage OUT. This provides greater freedom in circuit design since no constraints have to be imposed by circuit operation timing.

As described above, according to the first embodiment of the present invention, when the input voltage to the inverter 3 exceeds the threshold voltage Vth, the transistor 4 is switched OFF to isolate the MOS capacitors 20 and 21 from the node N1. As a result, the time constant of the node N1 is reduced, and the node N1 rises rapidly to the high level "H", departing quickly from the threshold value Vth. This serves to reduce the chance of being subjected to the effects of noise, etc. and also keep the node N1 from being affected by the discharging of the MOS capacitor 21 by the control signal S1.

Figure 12:
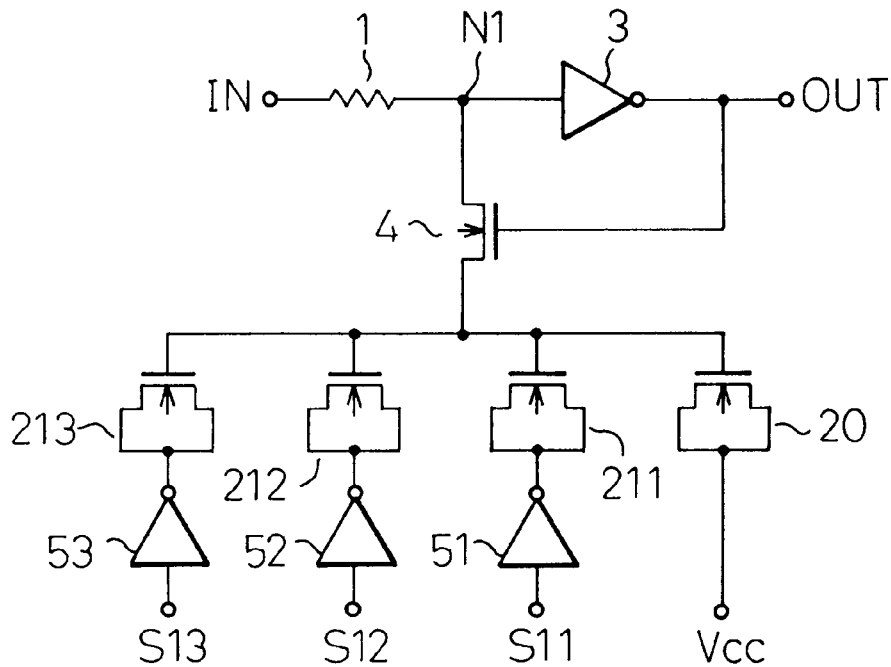
FIG. 12 is a circuit diagram showing a modified example of the delay circuit shown in FIG. 10.

FIG. 12 is a circuit diagram showing a modified example of the delay circuit of FIG. 10. As is apparent from the comparison between the delay circuits shown in FIGS. 10 and 12, the modified example is characterized by the provision of a plurality of MOS capacitors 21 (three in the illustrated example) whose connection (contribution) is controlled by the control signal S1. More specifically, in the modified example of FIG. 12, N-channel MOS transistors (MOS capacitors) 20 and 211 to 213 are provided, each with its drain and source connected together, and one end of each of these MOS capacitors is connected to the node N1 (input of the inverter) via the transistor 4. The other end of the MOS capacitor 20 is supplied with the high-level supply voltage Vcc, while the other ends of the MOS capacitors 211 to 213 are respectively supplied with control signals S11 to S13 via drivers (MOS inverters) 51 to 53, respectively. The resistor 1 and the MOS capacitors, 20 and 211 to 213, together constitute the charging circuit (charge/discharge circuit).

Here, the capacitance values of the MOS capacitors 211 to 213 may be set identical, or may be set in proportions of 1:2:4 as powers of 2, or may be set in various ways as needed. The connections (contributions) of these MOS capacitors 211 to 213 are controlled by the control signals S11 to S13 to obtain the necessary delay time. The operation of the transistor 4, etc. is the same as the first embodiment shown in FIGS. 10 and 11.

Figure 13:
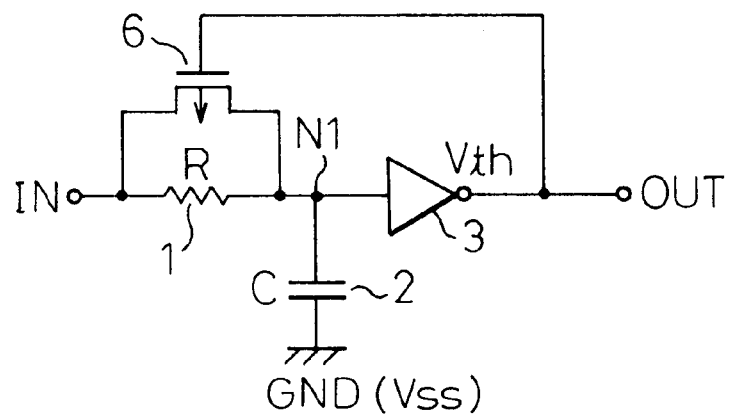
FIG. 13 is a circuit diagram showing a second embodiment of a delay circuit according to the present invention.

FIG. 13 is a circuit diagram showing a second embodiment of the delay circuit according to the present invention.

As shown in FIG. 13, the delay circuit comprises, for example, a resistor 1, a capacitor 2, an inverter (CMOS inverter) 3, and a P-channel MOS transistor 6.

In the delay circuit shown in FIG. 13, the transistor 6 is connected in parallel with the resistor 1, and the output signal OUT is applied to the gate of the transistor 6. More specifically, in response to a level change of the output signal OUT, the resistor 1 is short-circuited by the transistor 6 so that the input signal IN is supplied directly (via the transistor 6) to the node N1. The resistor 1 and the capacitor 2 together constitute a charging circuit (charge/discharge circuit).

Figure 14:
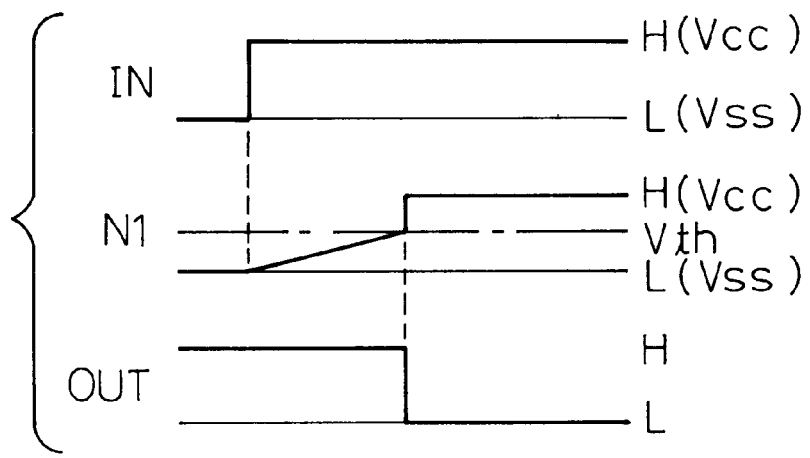
FIG. 14 is a waveform diagram for explaining an operation of the delay circuit shown in FIG. 13.

FIG. 14 is a waveform diagram for explaining the operation of the delay circuit shown in FIG. 13.

As shown in FIG. 14, when the input signal IN changes from a low level "L" to a high level "H", the input voltage (N1: charge/discharge signal) to the inverter 3 slowly rises in accordance with the time constant (T=RC) of the resistor 1 and capacitor 2, and when the threshold voltage Vth of the inverter 3 is exceeded, the output signal OUT with inverted level (low level "L") is output. In response to the output signal OUT thus changing from the high level "H" to the low level "L", the P-channel MOS transistor 6 changes from the OFF state to the ON state, and thus the resistor 1 is short-circuited by the transistor 6. In this condition, the input signal IN is supplied via the transistor 6 to the node N1, thereby reducing the value of the time constant (T=RC) due to the resistor 1 and capacitor 2, and thus allowing the node N1 to rise rapidly to the high level "H" (Vcc).

As a result, after the output signal has changed, even if the input signal IN fluctuates because of the effects of noise, variations in supply voltage, etc., no unwanted changes occur in the output signal OUT because the margin against noise is large. This serves to prevent the malfunctioning of the circuit operating by receiving the output signal OUT.

Figure 15:
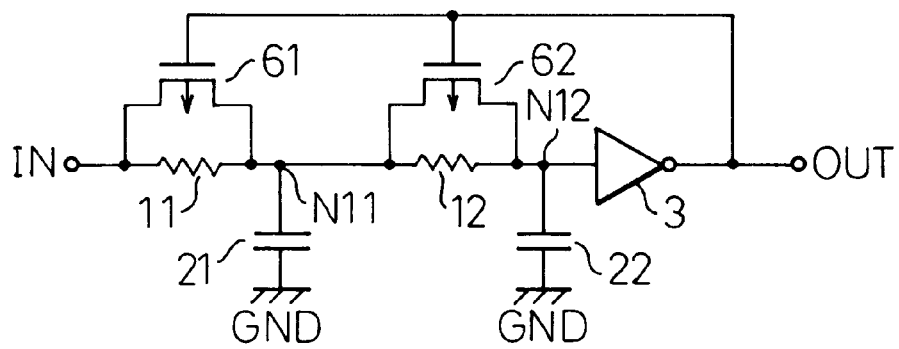
FIG. 15 is a circuit diagram showing a modified example of the delay circuit shown in FIG. 13.

FIG. 15 is a circuit diagram showing a modified example of the delay circuit of FIG. 13. As is apparent from the comparison between the delay circuits shown in FIGS. 13 and 15, the modified example is characterized by the provision of a plurality of resistors 1 and a plurality of P-channel MOS transistors 6 (two such sets are provided in the illustrated example). More specifically, in the modified example of FIG. 15, two sets, each set consisting of the same elements as the resistor 1, capacitor 2, and transistor 6 shown in FIG. 13, are connected in series (that is, the resistor 11, capacitor 21, and transistor 61 between the input IN and node N11, and the resistor 12, capacitor 22, and transistor 62 between the node N11 and node N12), and the output signal OUT is applied to the gates of the P-channel MOS transistors 61 and 62. With this configuration, the time constant when the transistors 61 and 62 are both OFF is increased to increase the circuit delay time. Here, the resistors 11 and 12 and capacitors 21 and 22 constitute the charging circuit (charge/discharge circuit). The operation of the transistors 61 and 62, etc. is the same as the second embodiment shown in FIGS. 13 and 14.

Figure 16:
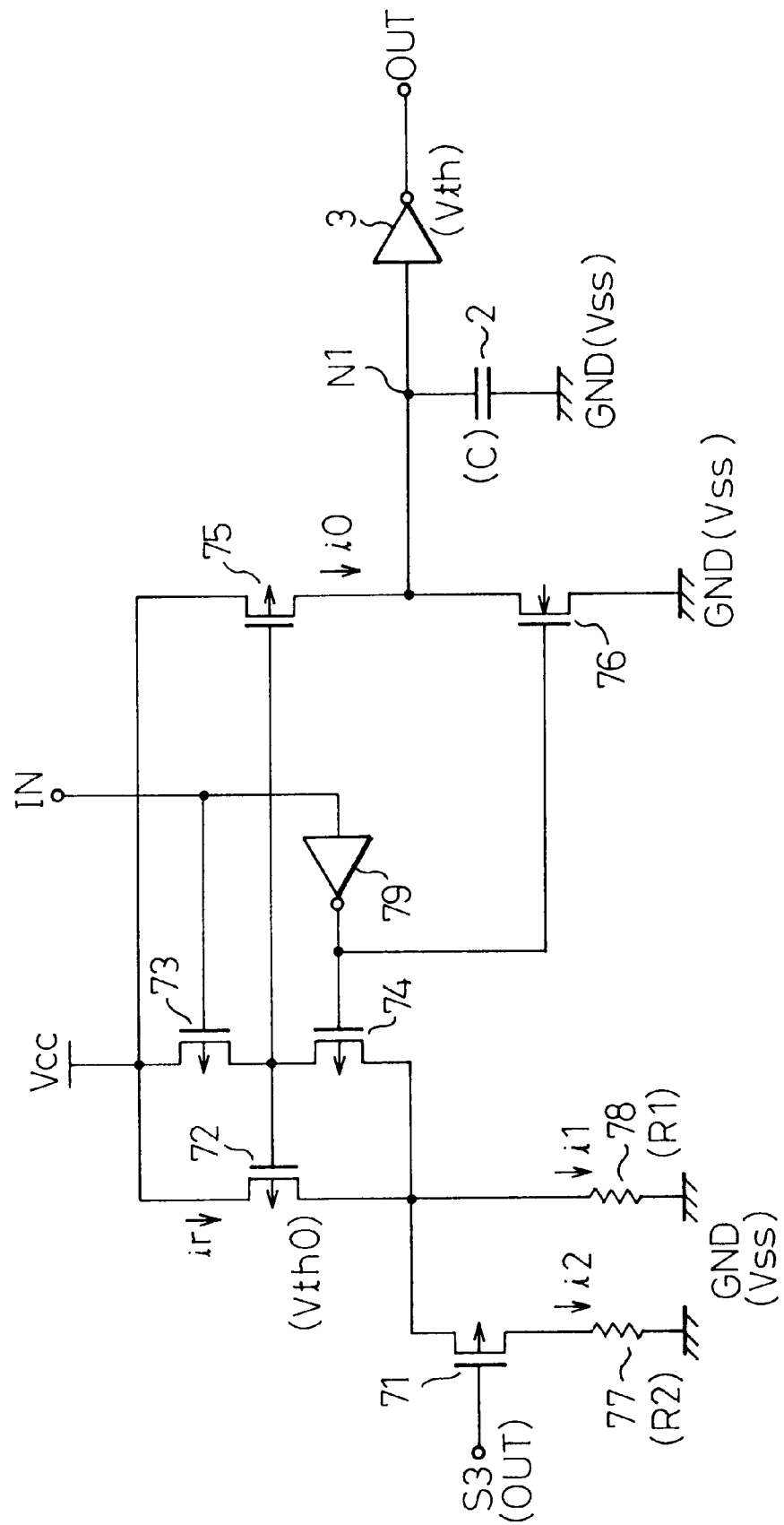
FIG. 16 is a circuit diagram showing a third embodiment of a delay circuit according to the present invention.
Figure 17:
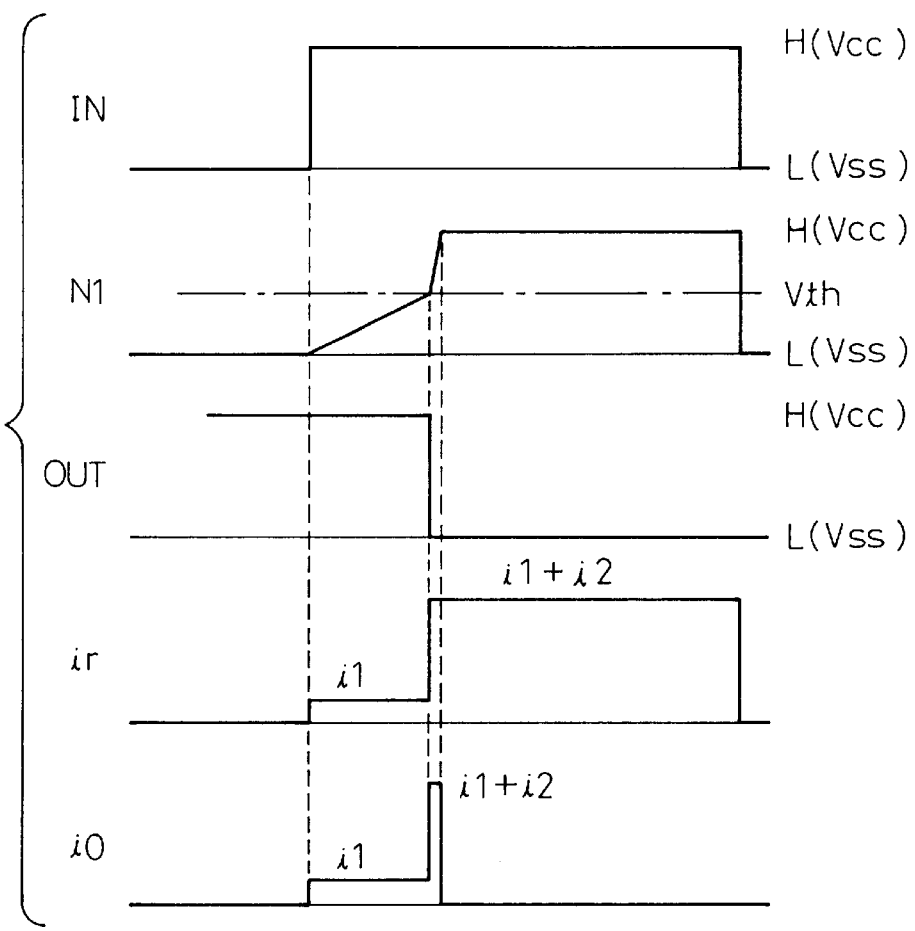
FIG. 17 is a waveform diagram for explaining an operation of the delay circuit shown in FIG. 16.

FIG. 16 is a circuit diagram showing a third embodiment of the delay circuit according to the present invention, and FIG. 17 is a waveform diagram for explaining the operation of the delay circuit shown in FIG. 16.

As shown in FIG. 16, the delay circuit of the third embodiment comprises a capacitor (capacitor elements) 2, inverters 3 and 79, a plurality of P-channel MOS transistors 71 to 75, an N-channel MOS transistor 76, and resistors (resistor elements) 77 and 78.

Here, the transistors 72 and 75 are connected in a current mirror arrangement (current mirror connection) so that the current ir flowing through the transistor 72 on the reference side is equal to the current i0 flowing through the transistor 75 on the current drawing side. The resistor 78 is a resistor which is provided to set the reference current and through which a current i1 flows. Into the resistor 77 flows a current i2 via the transistor 71 whose gate is supplied with a reference current adjusting control signal S3. The output signal OUT of the inverter 3 is used as the control signal S3. Accordingly, the transistor 71 is OFF when the control signal S3 (output signal OUT) is at the high level "H", and ON when it is at the low level "L". Here, the current source 75 and the capacitor 2 together constitute a charging circuit (charge/discharge circuit).

The transistors 73 and 74 function as switches to control the isolation of the current source by the input signal IN, while the transistor 76 functions as a pull-down transistor.

As shown in FIG. 17, when the input signal IN is at the low level "L" (Vss), the N-channel MOS transistor 76 is ON, so that the voltage at the node N1 is pulled down to the low level "L". On the other hand, the P-channel MOS transistor 73 is ON, and the transistor 74 is OFF. As a result, the high level "H" (Vcc) is applied to the gate of the P-channel MOS transistor 75, so that the transistor 75 is OFF. The transistor 74 acts as a switch to prevent the current from the high-level power supply Vcc side from being supplied to the resistor 78 when the gate and drain of the transistor 72 are connected together.

Next, when the input signal IN goes to the high level "H", the transistor 76 is switched OFF, while the transistor 73 is switched OFF and the transistor 74 is switched ON. As a result, the current i1=(Vcc−Vth0)/R1 flows to the resistor 78. If the transistors 72 and 75 are identical in size, the current i1 flows through the transistor 75. Then, the voltage (charge/discharge signal) at the node N1 rises with (i1/C)t, where t is the time.

When the voltage at the node N1 exceeds the threshold value Vth of the inverter 3, the output OUT changes from the high level "H" to the low level "L", and the transistor 71 is switched ON. As a result, the current i is $i=i1+i2=(Vcc-Vth0)/(R1//R2)$ Since the transistors 72 and 75 are connected in a current mirror arrangement, it follows that ir=i0; therefore, if the current i2 is set sufficiently large, the node N1 rises rapidly.

In this way, the third embodiment achieves the same effect as obtained in the foregoing second embodiment. Further, if the input capacitance of the inverter 3 is large, and if the current i1 is set sufficiently small and the current i2 sufficiently large, then the capacitor 2 need not be provided. It will also be recognized that various circuit configurations are possible for the current source.

Figure 18:
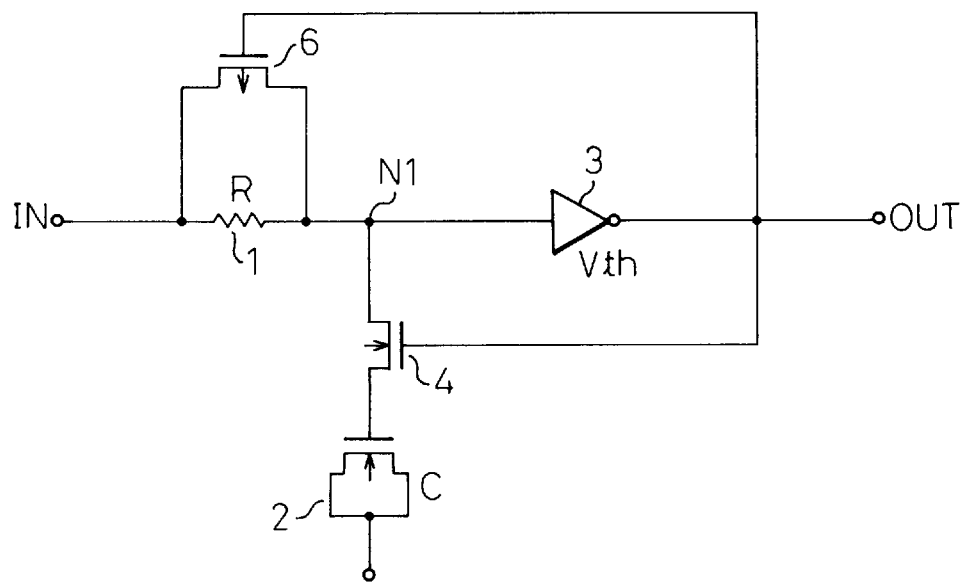
FIG. 18 is a circuit diagram showing a fourth embodiment of a delay circuit according to the present invention.

FIG. 18 is a circuit diagram showing a fourth embodiment of the delay circuit according to the present invention.

The delay circuit of the fourth embodiment shown in FIG. 18 is a combination of the previously described basic functional configuration (with reference to FIG. 8) and the configuration of the second embodiment (with reference to FIG. 13). More specifically, the N-channel MOS transistor (switch element) 4, whose gate is supplied with the output signal OUT, is provided between the input (node N1) of the inverter 3 and the capacitor (MOS capacitor) 2, while the P-channel MOS transistor (switch element) 6, whose gate is supplied with the output signal OUT, is connected in parallel with the resistor 1. Here, the resistor 1 and the capacitor 2 together constitute a charging circuit (charge/discharge circuit).

Figure 19:
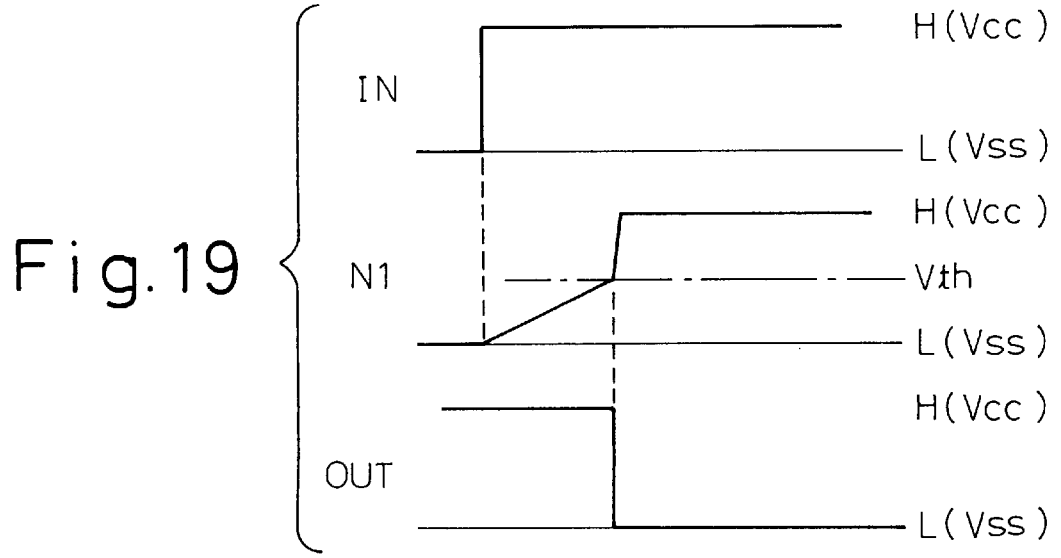
FIG. 19 is a waveform diagram for explaining an operation of the delay circuit shown in FIG. 18.

Figure 19 is a waveform diagram for explaining the operation of the delay circuit shown in FIG. 18.

As shown in FIG. 19, when the input signal IN is at a low level "L", and the output signal OUT is at a high level "H", the N-channel MOS transistor 4 is ON and the P-channel MOS transistor 6 is OFF. Accordingly, the input signal N1 slowly rises in accordance with the time constant (T=RC) of the resistor 1 and capacitor 2, and when the threshold voltage Vth of the inverter 3 is exceeded, the output signal OUT with inverted level (low level "L") is output. In response to the output signal OUT thus changing from the high level "H" to the low level "L", the N-channel MOS transistor 4 changes from the ON state to the OFF state, and the P-channel MOS transistor 6 changes from the OFF state to the ON state. As a result, the MOS capacitor 2 is isolated from the node N1, and the resistor 1 is short-circuited by the transistor 6, allowing the node N1 to rise rapidly to the high level "H" (Vcc).

Therefore, after the output signal has changed, even if the input signal IN fluctuates because of the effects of noise, variations in supply voltage, etc., no unwanted changes occur in the output signal OUT because the margin against noise is large. This serves to prevent the malfunctioning of the circuit operating by receiving the output signal OUT.

FIG. 20 is a circuit diagram showing a fifth embodiment of the delay circuit according to the present invention.

As shown in FIG. 20, the delay circuit of the fifth embodiment uses a comparator 9; the input signal IN is applied via the resistor 1 to a positive logic input (node N1) of the comparator 9, and the node N1 is connected to the capacitor 2 whose other end is grounded (connected to the low-level voltage supply line (GND; Vss)). The output signal OUT is supplied to the gate of an N-channel MOS transistor (switch element) 84 to control the connection between the high-level voltage supply line (Vcc) and one end of a resistor 83. The other end of the resistor 83 is connected to a negative logic input (node N2) of the comparator 9, and also to the high-level voltage supply line (Vcc) via a resistor R81 and the low-level voltage supply line (Vss) via a resistor R82. That is, the negative logic input of the comparator 9 is supplied with a voltage V1 divided through the resistors R81 and 83 and resistor R82 (when the transistor 84 is ON), or with a voltage V2 divided through the resistors R81 and R82 (when the transistor 84 is OFF). The relation V1>V2 holds between the voltage V1 and voltage V2.

FIG. 21 is a waveform diagram for explaining the operation of the delay circuit shown in FIG. 20.

As shown in FIG. 21, when the input signal IN is at a low level "L", and the output signal OUT is at a high level "H", the N-channel MOS transistor 84 is ON, so that the voltage at the node N2 (the voltage applied to the negative logic input of the comparator 9) is equal to the voltage V1 (>V2) divided through the resistors R81 and 83 and resistor R82.

The input signal IN slowly rises in accordance with the time constant (T=RC) of the resistor 1 and MOS capacitor 2, and when the voltage at the node N1 (the voltage applied to the positive logic input of the comparator 9) exceeds the voltage at the node N2 (the voltage applied to the negative logic input of the comparator 9), the output signal OUT changes from the high level "H" to the low level "L". In response to the output signal OUT changing to the low level "L", the N-channel MOS transistor 84 is switched OFF, and the resistor 83 is thus isolated from the high-level voltage supply line (Vcc). As a result, the voltage at the node N2 (the voltage applied to the negative logic input of the comparator 9) is now equal to the voltage V2 (<V1) divided through the resistors R81 and R82. Therefore, after the output signal has changed, even if the input signal IN fluctuates because of the effects of noise, variations in supply voltage, etc., no unwanted changes occur in the output signal OUT because the margin against noise is large. This serves to prevent the malfunctioning of the circuit operating by receiving the output signal OUT.

Each of the above embodiments has been described as being applied to a delay circuit that uses the rising of an input signal, but it will be appreciated that the invention may be applied to a delay circuit that uses the rising of an input signal with the polarity inverted, or to a delay circuit that uses both the rising and falling of an input signal. When using the rising of an input signal, the charging circuit is configured as a discharging circuit (charge/discharge means). Further, it will be noted that the delay circuit of each of the above embodiments can be used, for example, as the delay circuit 100 in the flash EEPROM shown in FIG. 5.

As described in detail above, according to the present invention, by quickly moving the signal not contributing to the delay action of the delay circuit away from the input threshold value of the next-stage circuit, the chance of being subjected to the effects of noise, etc. can be reduced, and circuit reliability can thus be enhanced. Furthermore, when the invention is applied to a semiconductor memory device or the like having an auto power-down function, design freedom can be increased.

Many different embodiments of the present invention may be constructed without departing from the spirit and scope of the present invention, and it should be understood that the present invention is not limited to the specific embodiments described in this specification, except as defined in the appended claims.

What is claimed is:

1. A delay circuit comprising:
    a charge/discharge circuit for moderating a slope of change of an input signal; and
    a logic circuit, receiving a charge/discharge signal output from said charge/discharge circuit, for changing an output signal of said logic circuit when the charge/discharge signal exceeds a threshold value of said logic circuit, wherein:
    said charge/discharge circuit comprises a switch element whose one end is connected to an input of said logic circuit, and a capacitor element whose one end is connected to the other end of said switch element, wherein a switching operation of said switch element is controlled by the output signal of said logic circuit to vary a time constant of said charge/discharge circuit due to said capacitor element.

2. A delay circuit as claimed in claim 1, wherein said switch element is controlled in such a manner as to be switched OFF by the output signal of said logic circuit when the output signal of said logic circuit changes in response to said charge/discharge signal exceeding the threshold value of said logic circuit.

3. A delay circuit as claimed in claim 1, wherein there are provided a plurality of said capacitor elements whose connection to the input of said logic circuit is controlled by said switch element, and said plurality of capacitor elements are arranged in parallel with each other.

4. A delay circuit as claimed in claim 3, wherein at least one of said plurality of capacitor elements is connected at one end to the other end of said switch element and at the other end to a prescribed power supply line.

5. A delay circuit as claimed in claim 3, wherein at least one of said plurality of capacitor elements is connected at one end to the other end of said switch element and at the other end to an output of a driver circuit supplied with a prescribed control signal.

6. A delay circuit as claimed in claim 1, wherein said charge/discharge circuit is inserted in an input of said logic circuit, and further comprises a resistor element for supplying said input signal via said resistor element, and another switch element disposed in parallel with said resistor element, wherein a switching operation of said another switch element is controlled by the output signal of said logic circuit to vary the time constant of said charge/discharge circuit due to said resistor element.

7. A delay circuit as claimed in claim 6, wherein said another switch element is controlled in such a manner as to be switched ON by the output signal of said logic circuit when the output signal of said logic circuit changes in response to said charge/discharge signal exceeding the threshold value of said logic circuit.

8. A delay circuit as claimed in claim 6, wherein there are provided a plurality of said another switch elements and a plurality of said resistor elements whose short-circuiting with the input of said logic circuit is controlled by said another switch element, and said plurality of another switch elements and said plurality of resistor elements are respectively arranged in series with each other.

9. A delay circuit as claimed in claim 8, wherein said plurality of another switch elements for controlling the short-circuiting of said plurality of resistor elements are each controlled for switching, by the output signal of said logic circuit.

10. A delay circuit as claimed in claim 1, wherein said logic circuit comprises a CMOS inverter.

11. A delay circuit as claimed in claim 1, wherein said capacitor element is constituted as a MOS capacitor.

12. A semiconductor memory device having:
    a cell matrix having a plurality of memory cells;
    a data latch for latching readout data output from said cell matrix;
    an address transfer detection circuit for detecting an address signal change;
    a delay circuit, outputting a latch control signal to said data latch in accordance with an output signal of said address transfer detection circuit, for controlling said data latch to output the readout data in synchronism with the latch control signal, wherein said delay circuit comprises:
    a charge/discharge circuit for moderating a slope of change of an input signal; and
    a logic circuit, receiving a charge/discharge signal output from said charge/discharge circuit, for changing an output signal of said logic circuit when the charge/ discharge signal exceeds a threshold value of said logic circuit, wherein:

said charge/discharge circuit comprises a switch element whose one end is connected to an input of said logic circuit, and a capacitor element whose one end is connected to the other end of said switch element, wherein a switching operation of said switch element is controlled by the output signal of said logic circuit to vary a time constant of said charge/discharge circuit due to said capacitor element.

13. A semiconductor memory device as claimed in claim 12, wherein said switch element is controlled in such a manner as to be switched OFF by the output signal of said logic circuit when the output signal of said logic circuit changes in response to said charge/discharge signal exceeding the threshold value of said logic circuit.

14. A semiconductor memory device as claimed in claim 12, wherein there are provided a plurality of said capacitor elements whose connection to the input of said logic circuit is controlled by said switch element, and said plurality of capacitor elements are arranged in parallel with each other.

15. A semiconductor memory device as claimed in claim 14, wherein at least one of said plurality of capacitor elements is connected at one end to the other end of said switch element and at the other end to a prescribed power supply line.

16. A semiconductor memory device as claimed in claim 14, wherein at least one of said plurality of capacitor elements is connected at one end to the other end of said switch element and at the other end to an output of a driver circuit supplied with a prescribed control signal.

17. A semiconductor memory device as claimed in claim 12, wherein said charge/discharge circuit is inserted in an input of said logic circuit, and another comprises a resistor element for supplying said input signal via said resistor element, and a another switch element disposed in parallel with said resistor element, wherein a switching operation of said another switch element is controlled by the output signal of said logic circuit to vary the time constant of said charge/discharge circuit due to said resistor element.

18. A semiconductor memory device as claimed in claim 17, wherein said another switch element is controlled in such a manner as to be switched ON by the output signal of said logic circuit when the output signal of said logic circuit changes in response to said charge/discharge signal exceeding the threshold value of said logic circuit.

19. A semiconductor memory device as claimed in claim 17, wherein there are provided a plurality of said another switch elements and a plurality of said resistor elements whose short-circuiting with the input of said logic circuit is controlled by said another switch element, and said plurality of another switch elements and said plurality of resistor elements are respectively arranged in series with each other.

20. A semiconductor memory device as claimed in claim 19, wherein said plurality of another switch elements for controlling the short-circuiting of said plurality of resistor elements are each controlled for switching, by the output signal of said logic circuit.

21. A semiconductor memory device as claimed in claim 12, wherein said logic circuit comprises a CMOS inverter.

22. A semiconductor memory device as claimed in claim 12, wherein said capacitor element is constituted as a MOS capacitor.

23. A semiconductor memory device as claimed in claim 12, wherein said semiconductor memory device is a flash EEPROM.

* * * * *